US009445516B2

(12) United States Patent
Dinh et al.

(10) Patent No.: US 9,445,516 B2
(45) Date of Patent: Sep. 13, 2016

(54) WEATHERPROOF CORNER BOX

(71) Applicant: Thomas & Betts International, Inc., Wilmington, DE (US)

(72) Inventors: Cong Thanh Dinh, Collierville, TN (US); Peter J. Galluci, Collierville, TN (US)

(73) Assignee: Thomas & Betts International LLC, Wilmington, DE (US)

( * ) Notice: Subject to any disclaimer, the term of this patent is extended or adjusted under 35 U.S.C. 154(b) by 197 days.

(21) Appl. No.: 13/951,052

(22) Filed: Jul. 25, 2013

(65) Prior Publication Data

US 2014/0054083 A1 Feb. 27, 2014

Related U.S. Application Data

(60) Provisional application No. 61/693,553, filed on Aug. 27, 2012.

(51) Int. Cl.
*H05K 5/03* (2006.01)
*H02G 3/08* (2006.01)
*H02G 3/10* (2006.01)

(52) U.S. Cl.
CPC ............... *H05K 5/03* (2013.01); *H02G 3/088* (2013.01); *H02G 3/10* (2013.01)

(58) Field of Classification Search
USPC .................................................... 174/50, 58
See application file for complete search history.

(56) References Cited

U.S. PATENT DOCUMENTS

| 1,866,954 | A |   | 7/1932  | Svetcoff |
| 2,140,771 | A |   | 12/1938 | Slayter et al. |
| 2,640,670 | A |   | 6/1953  | Lampe |
| 2,730,261 | A | * | 1/1956  | Tutt ............................... 220/3.7 |
| 2,957,040 | A |   | 10/1960 | Sharrar |
| 4,158,471 | A | * | 6/1979  | Logsdon ............... D06F 39/083 137/360 |
| 4,217,629 | A |   | 8/1980  | Russell |
| 5,057,980 | A |   | 10/1991 | Russell |
| 5,297,011 | A |   | 3/1994  | Triunfol |
| 5,349,134 | A |   | 9/1994  | Russell |
| 5,562,340 | A |   | 10/1996 | Lovell |
| D376,117  | S |   | 12/1996 | Kovens |
| 5,961,205 | A |   | 10/1999 | Lovell |
| 6,642,447 | B1 | * | 11/2003 | Mailloux ........................ 174/50 |
| 7,045,706 | B1 |   | 5/2006  | Lincoln, III et al. |
| 7,075,004 | B1 | * | 7/2006  | Gretz ............................... 174/50 |
| 7,173,184 | B2 | * | 2/2007  | Hull et al. ...................... 174/58 |

(Continued)

FOREIGN PATENT DOCUMENTS

CA            ID55190         11/1985

*Primary Examiner* — Dhirubhai R Patel
(74) *Attorney, Agent, or Firm* — Taft Stettinius & Hollister LLP

(57) ABSTRACT

An electrical box may include a housing body, enclosing a cavity, which includes an access opening extending across a first plane of the housing body, and which includes a plurality of mounting outlets configured to enable electrical devices to be mounted to the housing body to face a plurality of different directions. The electrical box may further include one or more mounting brackets attached to the housing body and a cover plate shaped to match and cover the access opening of the housing body. The housing body may include a first side wall and second side wall aligned to form an inside corner of the housing body, wherein the inside corner of the housing body is configured to align with an outside corner of a building or a structure, and wherein the first side wall and the second side wall are perpendicular to the first plane.

19 Claims, 8 Drawing Sheets

(56) References Cited

U.S. PATENT DOCUMENTS

| | | |
|---|---|---|
| 7,348,487 B2 * | 3/2008 | Drane .................... 174/66 |
| 7,595,447 B2 | 9/2009 | Vrame |
| 7,798,668 B2 | 9/2010 | Cunius |
| 7,858,878 B2 | 12/2010 | Garavuso et al. |
| 8,193,444 B2 * | 6/2012 | Rodenberg .................. 174/50 |
| 8,796,548 B2 * | 8/2014 | Rost .................. H05K 5/061 174/50 |
| 9,035,201 B2 * | 5/2015 | Jones ................... 174/486 |
| 2003/0024171 A1 | 2/2003 | Kao |

\* cited by examiner

WEATHERPROOF CORNER BOX

CROSS-REFERENCE TO RELATED APPLICATION

This application claims priority under 35 U.S.C. §119, based on U.S. Provisional Patent Application No. 61/693,553 filed Aug. 27, 2012, the disclosure of which is hereby incorporated by reference herein.

BACKGROUND INFORMATION

Electrical devices are often mounted on the outside walls of buildings. For example, a camera, a light, a motion sensor, and/or another type of electrical device may be mounted to an outside wall, or the roof, of a building. The electrical device may need to be wired to a power source and may include electrical connections to other devices. For example, a camera may include a connection to a display device located within the building. A junction box may be used to house the electrical connections and to function as a point of attachment for the electrical device. Multiple junction boxes may be required if multiple electrical devices are to be mounted on different sides of a building.

DETAILED DESCRIPTION OF PREFERRED EMBODIMENTS

The following detailed description refers to the accompanying drawings. The same reference numbers in different drawings identify the same or similar elements.

Implementations described herein relate to a weatherproof corner box. The weatherproof corner box may be mounted on the corner of a building and may accommodate electrical devices at multiple position angles via mounting outlets. For example, electrical devices such as floodlights or cameras may be mounted onto the corner box via mounting outlets to cover both sides of a building from a corner. Electrical wiring associated with the electrical devices may be protected within the corner box. The corner box may include an inside portion/corner that aligns with the outside corner of the building. The inside portion/corner may include one or more openings that may allow wiring, such as a power cord, to exit the corner box and connect to wiring located either inside the building or along a wall of the building.

Figure 1B:
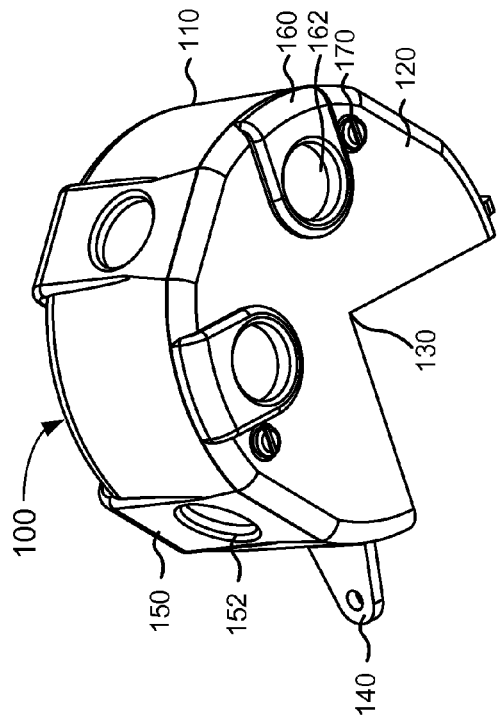
FIGS. 1A-1D are diagrams illustrating isometric views of a weatherproof corner box according to an implementation described herein.
Figure 1D:
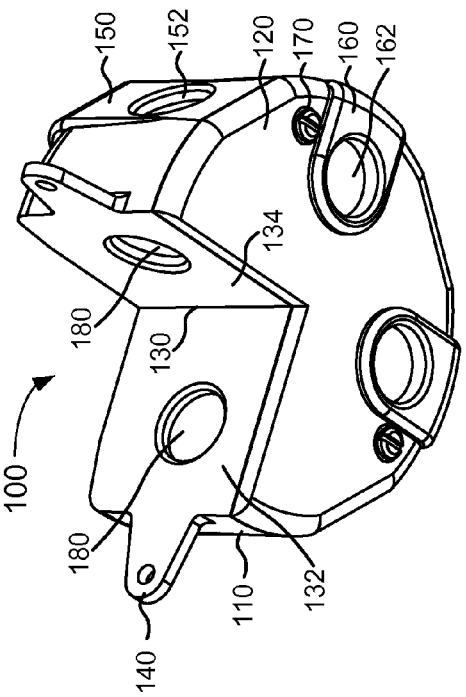
Figure 1A:
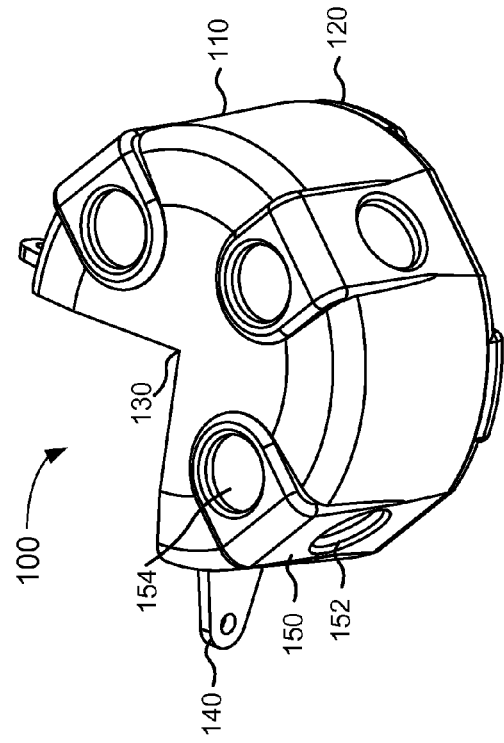

FIGS. 1A-1D are diagrams illustrating isometric views of a corner box 100 according to an implementation described herein. FIG. 1A shows an isometric view of corner box 100 as viewed from the top. As shown in FIG. 1A, corner box 100 may include a housing body 110 and a cover plate 120. Housing body 110 may enclose a hollow cavity, or a substantially hollow cavity, from all sides except the bottom. Housing body 110 may include an inside corner 130, one or more mounting brackets 140 (referred to herein collectively as "mounting brackets 140" and individually as "mounting bracket 140"), and one or more mounting outlet areas 150 (referred to herein collectively as "mounting outlet areas 150" and individually as "mounting outlet area 150").

Housing body 110 may be cylindrical with the exception of a sector or portion that is not included. For example, a right angle (i.e., 90 degree) sector may be cut out of the cylinder shape. The right angle sector cut out may be formed by a first side wall 132 and a second side wall 134 of housing body 110 that form inside corner 130. Inside corner 130 may be configured to align with an outside corner of a building when corner box 100 is mounted onto the outside corner of the building visa mounting brackets 140. Mounting bracket 140 may include one or more holes for accommodating a fastener, such as a screw or a bolt, to mount corner box 100 to a building or another type of structure.

Mounting outlet area 150 may include a reinforced area of housing body 110 that includes one or more mounting outlets. For example, mounting outlet area 150 may include a side mounting outlet 152 and a top mounting outlet 154. Side mounting outlet 152 and top mounting outlet 154 may include a knockout plate or a plug (not shown) that may be removed to create a mounting outlet opening. For example, a knockout plate may include a plate that is structurally weaker around the edges of the mounting outlet, or is attached via removable tabs, and may thus be knocked out with a tool to create the mounting outlet opening. In one implementation, a plug may be removed from a mounting outlet when an electrical device is mounted into corner box 100. In another implementation, the mounting outlet may include screw threads and the plug may be removed by unscrewing the plug.

An electrical device, such as a floodlight or a camera may be mounted on or in corner box 100 through the created mounting outlet opening. Mounting outlet area 150 may be reinforced by including a greater wall thickness than other areas of housing body 110, as illustrated in FIG. 1A. The greater wall thickness around mounting outlet area 150 may provide increased structural stability around a mounting outlet, ensuring that any electrical device mounted to corner box 100 using the mounting outlet does not compromise the structural integrity of corner box 100.

In one implementation, an electrical device may be mounted into side mounting outlet 152 or top mounting outlet 154 by being outfitted with a grommet that snaps into, or screws into, side mounting outlet 152 or top mounting outlet 154. The wires from the electrical device may pass through the grommet. The use of a grommet may ensure a weatherproof seal with respect to the mounting outlet when the electrical device is mounted. In another implementation, the mounting outlet may be sealed using a sealing material, such as silicon, after an electrical device is mounted into the mounting outlet.

As shown in FIG. 1A, corner box 100 may include three mounting outlet areas 150 spaced equidistantly from each other on housing body 110. Thus, housing body 110 may include three side mounting outlets 152 located equidistantly along the top surface of housing body 110 and three top mounting outlets 154, located equidistantly along the side wall of housing body 110. The three side mounting outlets 152 may be aligned with the three top mounting outlets 154. Thus, housing body 110 may include six mounting outlet that enable electrical devices to be mounted to corner box 100 to point in at least six different directions.

FIG. 1B shows an isometric view of corner box 100 as viewed from the bottom. As shown in FIG. 1B, cover plate 120 may be shaped to match and cover the bottom surface of housing body 110. Thus, the bottom surface may have a circular shape with the exception of a right angle sector cut out to match to match the cutout in housing body 110 (i.e., the shape formed by first side wall 132 and second side wall 134, which form inside corner 130). Cover plate 120 may include one or more cover plate mounting outlet areas 160 (referred to herein collectively as "cover plate mounting outlet areas 160" and individually as "cover plate mounting outlet area 160) and one or more cover plate fasteners 170 (referred to herein collectively as "cover plate fasteners 170" and individually as "cover plate fastener 170").

Cover plate mounting outlet area 160 may include a reinforced area of cover plate 120 that includes a cover plate mounting outlet 162. As described above with respect to side mounting outlet 152 and top mounting outlet 154, cover plate mounting outlet 162 may include a knockout plate or a plug (not shown) that may be removed to create a mounting outlet opening. As shown in FIG. 1B, cover plate 120 may include two cover plate mounting outlet areas 160 and two cover plate mounting outlets 162.

Thus, corner box 100 may include eight mounting outlets: three side mounting outlets 152, three top mounting outlets 154, and two cover plate mounting outlets 162. The eight mounting outlets may enable electrical devices to be mounted in eight different positions on corner box 100, enabling electrical devices to be pointed in potentially eight different directions.

Figure 1C:
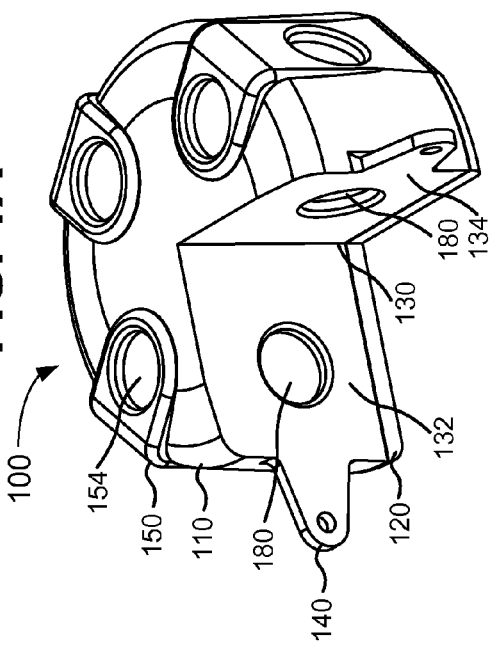

FIG. 1C shows an isometric view of corner box 100 as viewed from the top from a different angle than that of FIG. 1A. FIG. 1D shows an isometric view of corner box 100 as viewed from the bottom from a different angle than that of FIG. 1B. As shown in FIGS. 1C and 1D, inside corner 130 may include one or more inside corner openings 180 (referred to herein collectively as "inside corner openings 180" and individually as "inside corner opening 180"). Inside corner opening 180 may enable wiring, such as a wire cord, electrical conduits, etc., to pass from within corner box 100 to a location outside corner box 100. For example, inside corner opening 180 may be used to connect a power cord or conduits of an electrical device to a power source located inside a building, when corner box 100 is mounted to a corner of a building. As shown in FIG. 1C, a first side wall 132 forming inside corner 130 may include a first inside corner opening 180 and a second side wall 134 forming inside corner 130 may include a second inside corner opening 180.

Figure 2A:
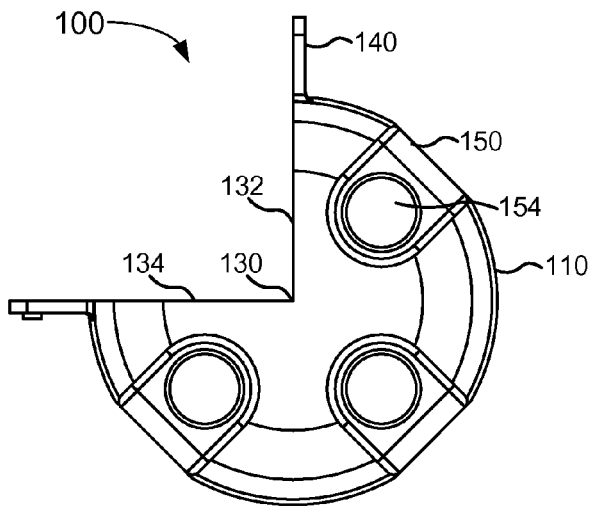
FIGS. 2A-2D are diagrams illustrating orthographic views of a weatherproof corner box according to an implementation described herein.
Figure 2B:
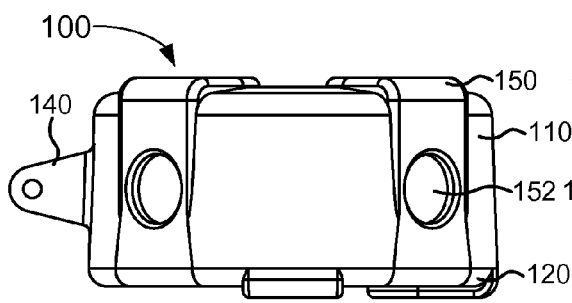
Figure 2C:
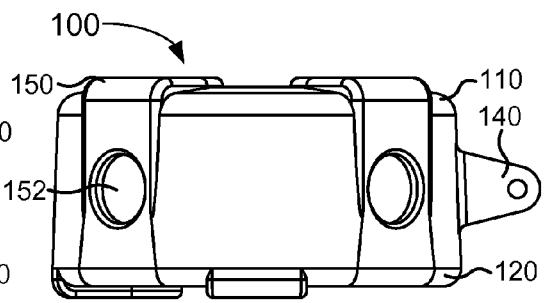
Figure 2D:
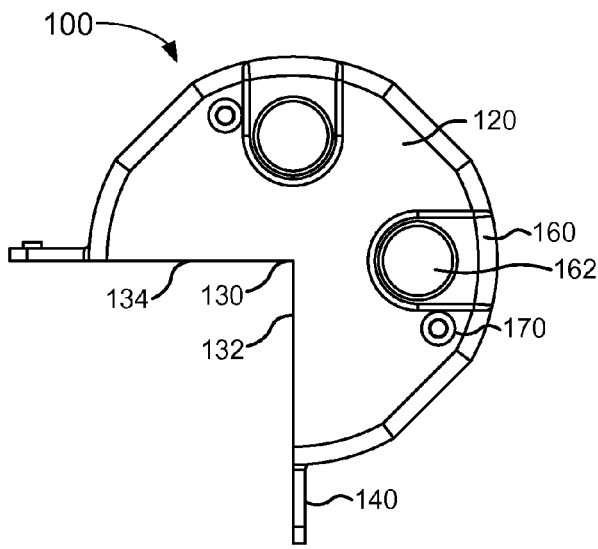

FIGS. 2A-2D are diagrams illustrating orthographic views of a weatherproof corner box according to an implementation described herein. FIG. 2A shows a top view of corner box 100, further illustrating the shape of housing body 110 and the positions of inside corner 130, mounting brackets 140, mounting areas 150, and top mounting outlets 154. FIG. 2B shows a left view of corner box 100, further illustrating the shape of housing body 110 and the positions of cover plate 120, inside corner 130, mounting outlet areas 150 and side mounting outlets 152. FIG. 2C shows a right view of corner box 100, further illustrating the shape of housing body 110 and the positions of cover plate 120, inside corner 130, mounting outlet areas 150 and side mounting outlets 152. FIG. 2D shows the bottom view of corner box 100, further illustrating the shape of cover plate 120 and the positions of inside corner 130, mounting brackets 140, cover plate mounting outlet areas 160, cover plate mounting outlets 162, and cover plate fasteners 170.

Figure 3B:
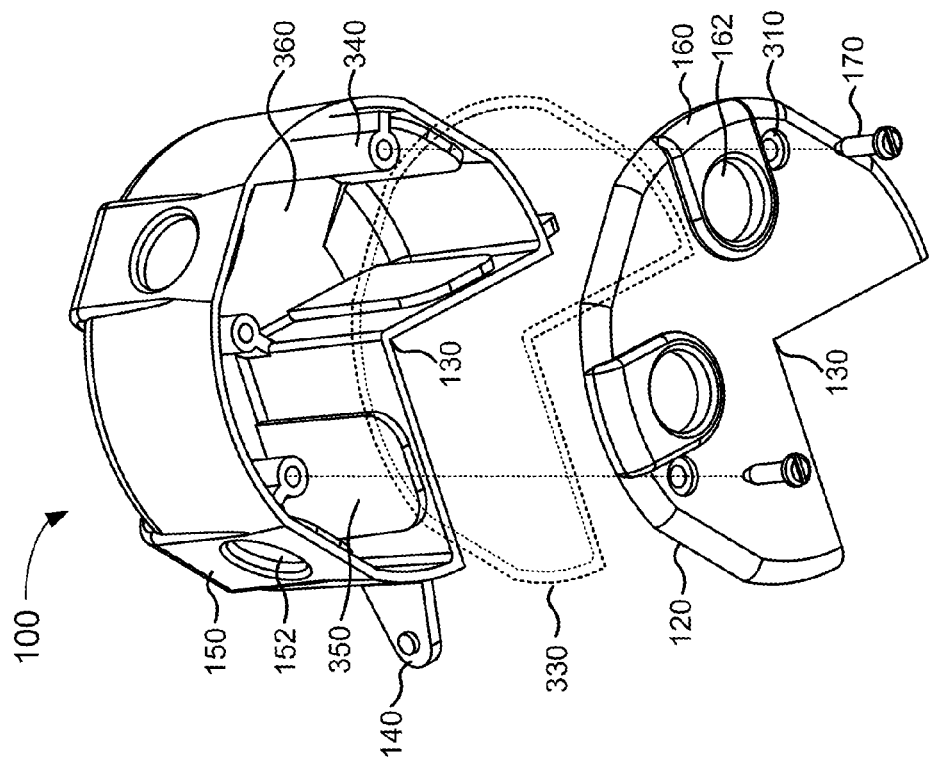
FIGS. 3A and 3B are diagrams illustrating expanded isometric views of a weatherproof corner box according to an implementation described herein.
Figure 3A:
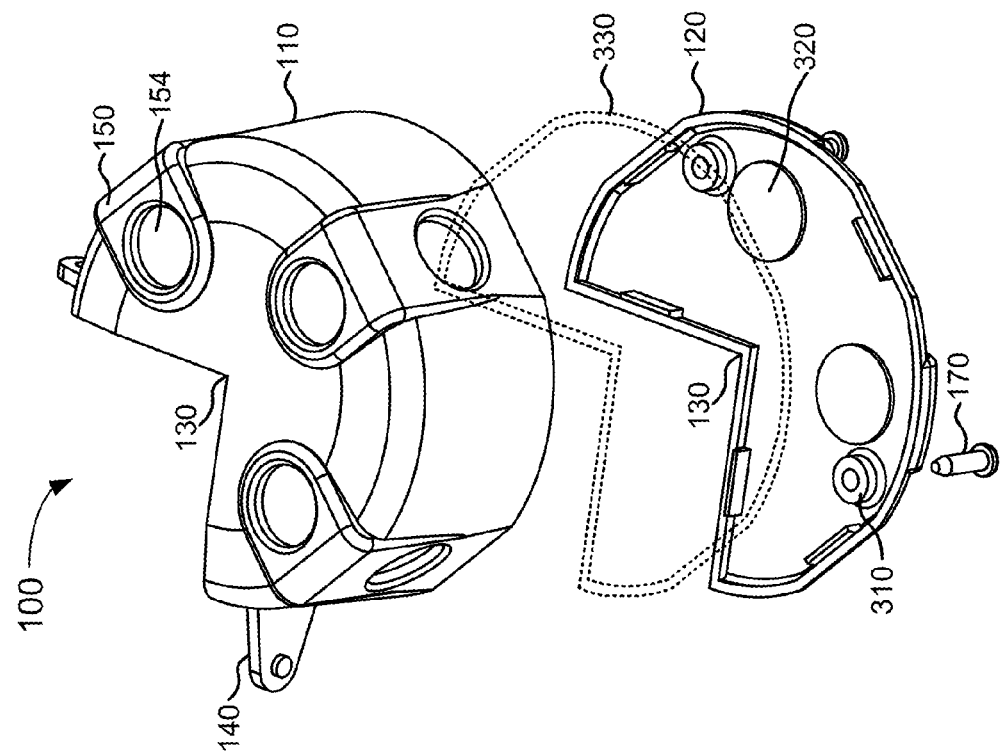

FIGS. 3A and 3B are diagrams illustrating expanded isometric views of a weatherproof corner box according to an implementation described herein. FIG. 3A shows an isometric view of corner box 100 from the top with cover plate 120 removed. As shown in FIG. 3A, cover plate 120 may include one or more cover plate fastener openings 310 (referred to herein collectively as "cover plate fastener openings 310" and individually as "cover plate fastener opening 310") and cover plate mounting outlet knockout plates 320 (referred to herein collectively as "cover plate mounting outlet knockout plates 320" and individually as "cover plate mounting outlet knockout plate 320"). Cover plate fastener openings 310 may accommodate cover plate fasteners 170. Cover plate mounting outlet knockout plate 320 may include a plate that is structurally weaker around the edges of the mounting outlet, or connected to cover plate 120 via breakaway tabs, and may thus be knocked out with a tool, or by hand, to create a mounting outlet opening. As explained above, in another implementation, cover plate mounting outlet knockout plate 320 may correspond to a plug that may be popped out or unscrewed. As shown in FIG. 3A, cover plate 120 may include two cover plate fastener openings 310 and two cover plate mounting outlet cover plates 320.

As also shown in FIG. 3A, corner box 100 may include a gasket 330 (shown via the dashed lines). Gasket 330 may be positioned between housing body 110 and cover plate 120. Gasket 330 may provide a weatherproof seal between housing body 110 and cover plate 120. For example, gasket 330 may prevent water or other contaminants from entering the hollow cavity of corner box 100 when cover plate 120 is fastened to housing body 110 using fasteners 170. In some implementations, gasket 330 may include a foam material. In other implementations, gasket 330 may include a rubber or plastic material. In yet other implementations, gasket 330 may include another type of material.

FIG. 3B shows an isometric view of corner box 100 from the bottom with cover plate 120 removed. FIG. 3B shows the hollow cavity inside housing body 110. As shown in FIG. 3B, housing body 110 may include one or more cover plate fastener receptacles 340 (referred to herein collectively as "cover plate fastener receptacles 340" and individually as "cover plate fastener receptacle 340") and one or more inside corner opening knockout plates 350 (referred to herein collectively as "inside corner opening knockout plates 350" and individually as "inside corner opening knockout plate 350").

Cover plate fastener receptacle 340 may accept cover plate fastener 170 and may enable cover plate 120 to be securely mounted to housing body 110 when cover plate fastener 170 is inserted into cover plate fastener receptacle 340. For example, if cover plate fastener receptacle 340 corresponds to a screw or bolt, cover plate fastener receptacle 340 may be threaded to accommodate the screw or bolt. Inside corner opening knockout plate 350 may include a plate that is structurally weaker around the edges of inside corner opening 180 and may thus be knocked out with a tool, or by hand, to create a mounting outlet opening. As explained above, in another implementation, inside corner opening knockout plate 350 may correspond to a plug that may be popped out or unscrewed.

Corner box 100 may be weatherproof. For example, corner box 100 may prevent water and/or other contaminants from entering the hollow cavity inside housing body 110. Thus, all openings in housing body 110 and cover plate 120, as well as access opening 360 of housing body 110 covered by cover plate 120, may be configured to prevent water and/or other contaminants from entering the inside of corner box 100. For example, any unused mounting outlets in housing body 110 or in cover plate 120, or any unused inside corner openings 180, may be covered by a knockout plate or a plug with a watertight seal. Furthermore, as explained above with reference to FIGS. 3A and 3B, gasket 330 may be included between housing body 110 and cover plate 120 to create a watertight seal between housing body 110 and cover plate 120.

In some implementations, corner box 100 may include a plastic material. For example, corner box 100 may be injection molded using a liquid plastic material that hardens into a solid form inside a mold in the shape of corner box 100. In implementations that use a plastic material, side mounting outlets 152, top mounting outlets 154, cover plate mounting outlets 162, and inside corner openings 180, may be covered with a knockout plate.

In other implementations, corner box 100 may be die cast out of a metal material, such as, for example, aluminum. In implementations that use an aluminum die cast material, side mounting outlets 152, top mounting outlets 154, cover plate mounting outlets 162, and inside corner openings 180, may be covered with plugs that may be unscrewed. The plugs may include a plastic material. In yet other implementations, corner box 100 may be formed out of sheet metal. A corner box 100 formed out of sheet metal may be powder coated to weatherproof corner box 100.

While FIGS. 1A-1D, 2A-2D, and 3A-3B illustrate corner box 100 with a particular arrangement and numbers of mounting brackets 140, mounting outlet areas 150, top mounting outlets 152, side mounting outlets 154, cover plate mounting outlet areas 160, cover plate mounting outlets 162, cover plate fasteners 170, inside corner openings 180, cover plate fastener openings 310, and/or cover plate fastener receiver receptacles 340, other implementations of corner box 100 may include a different number and/or arrangement of mounting brackets 140, mounting outlet areas 150, top mounting outlets 152, side mounting outlets 154, cover plate mounting outlet areas 160, cover plate mounting outlets 162, cover plate fasteners 170, inside corner openings 180, cover plate fastener openings 310, and/or cover plate fastener receiver receptacles 340. Furthermore, although FIGS. 1A-1D, 2A-2D, and 3A-3B show exemplary components of corner box 100, in other implementations, corner box 100 may include fewer components, different components, differently arranged components, or additional components than depicted in FIGS. 1A-1D, 2A-2D, and 3A-3B.

Figure 4:
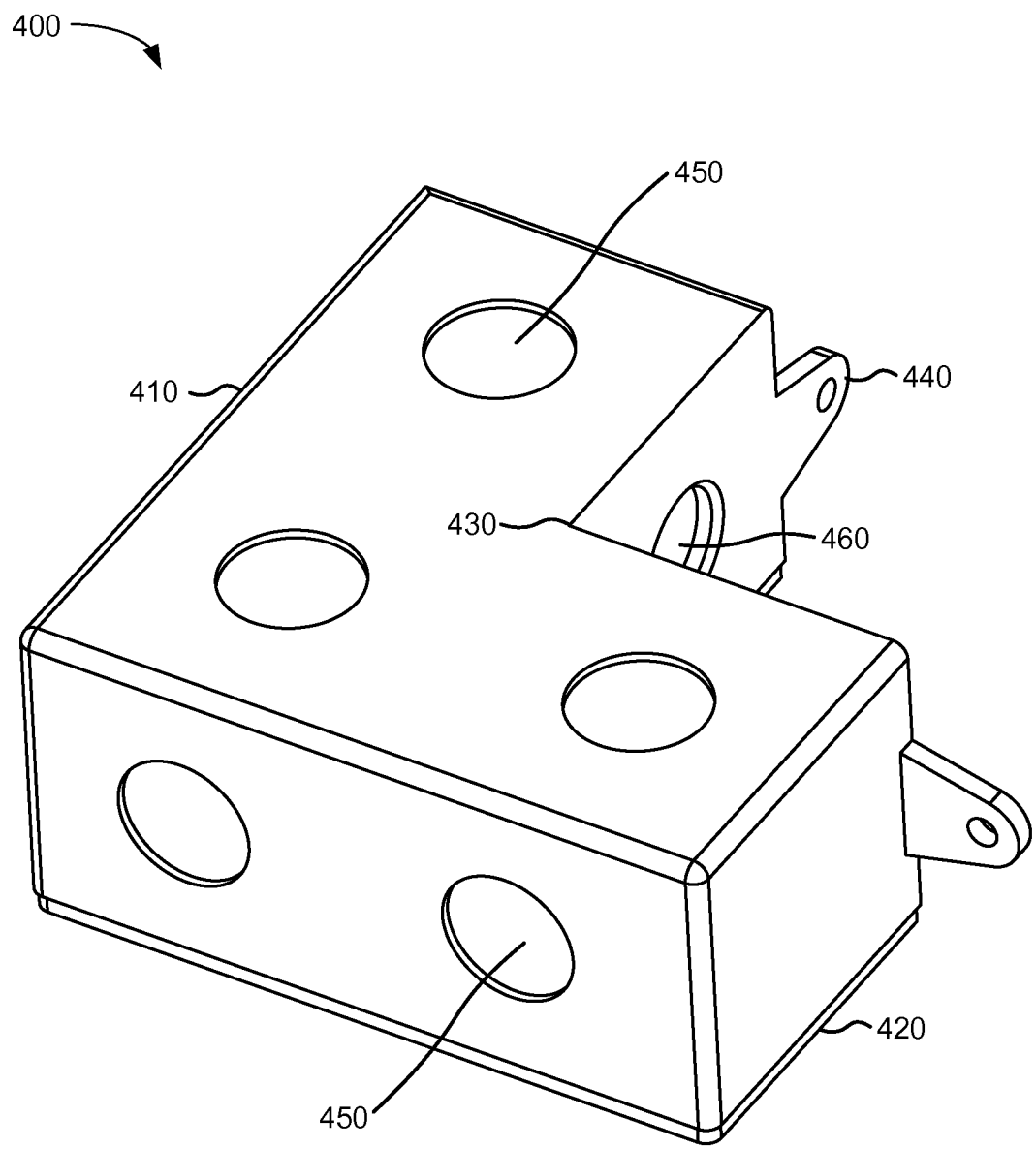
FIG. 4 is a diagram of a weatherproof corner box according to another implementation described herein.

FIG. 4 is a diagram of a weatherproof corner box 400 according to another implementation described herein. As shown in FIG. 4, corner box 400 may have a generally rectangular shape. For example, corner box 400 may have an L shape. Corner box 400 may include a housing body 410 and a cover plate 420.

Housing body 410 may enclose a hollow cavity from all sides except the bottom. Housing body 410 may include an inside corner 430, one or more mounting brackets 440 (referred to herein collectively as "mounting brackets 440" and individually as "mounting bracket 440"), and one or more mounting outlets 450 (referred to herein collectively as "mounting outlets 450" and individually as "mounting outlet 450").

As illustrated, housing body 410 may have an L shape, with inside corner 430 forming the inside corner of the L. Inside corner 430 may be formed by a first side wall and a second side wall of housing body 410. Inside corner 430 may be configured to align with an outside corner of a building when corner box 400 is mounted onto the outside corner of the building visa mounting brackets 440. Mounting bracket 440 may include one or more holes for accommodating a fastener, such as a screw or a bolt, to mount corner box 410 to a building or another type of rectangular standing structure.

Mounting outlet 450 may include a knockout plate or a plug that may be removed to create a mounting outlet opening. An electrical device, such as a floodlight or a camera may be mounted on or in corner box 400 through the created mounting outlet opening.

In one implementation, an electrical device may be mounted into mounting outlet 450 by being outfitted with a grommet that snaps into, or screws into, mounting outlet 450. The wires from the electrical device may pass through the grommet. The use of a grommet may ensure a weatherproof seal with respect to the mounting outlet when the electrical device is mounted. In another implementation, the mounting outlet may be sealed using a sealing material, such as silicon, after an electrical device is mounted into the mounting outlet.

As shown in FIG. 4, corner box 400 may include three mounting outlets 450 located equidistantly from each other on the top surface of housing body 410 and four mounting outlets 450 located equidistantly on the side surfaces of housing body 410 (e.g., two on each outward facing side of housing body 410). Furthermore, cover plate 420 may include one or more mounting outlets (not shown in FIG. 4).

As further shown in FIG. 4, the two side walls forming inside corner 430 may include one or more inside corner openings 460 (referred to herein collectively as "inside corner openings 460" and individually as "inside corner opening 460"). Inside corner opening 460 may enable wiring, such as a power cord, electrical conduits, etc. to pass from within corner box 400 to a location outside corner box 400. For example, inside corner opening 460 may be used to connect a power cord of an electrical device to a power source located inside a building, when corner box 400 is mounted to a corner of a building.

Figure 5:
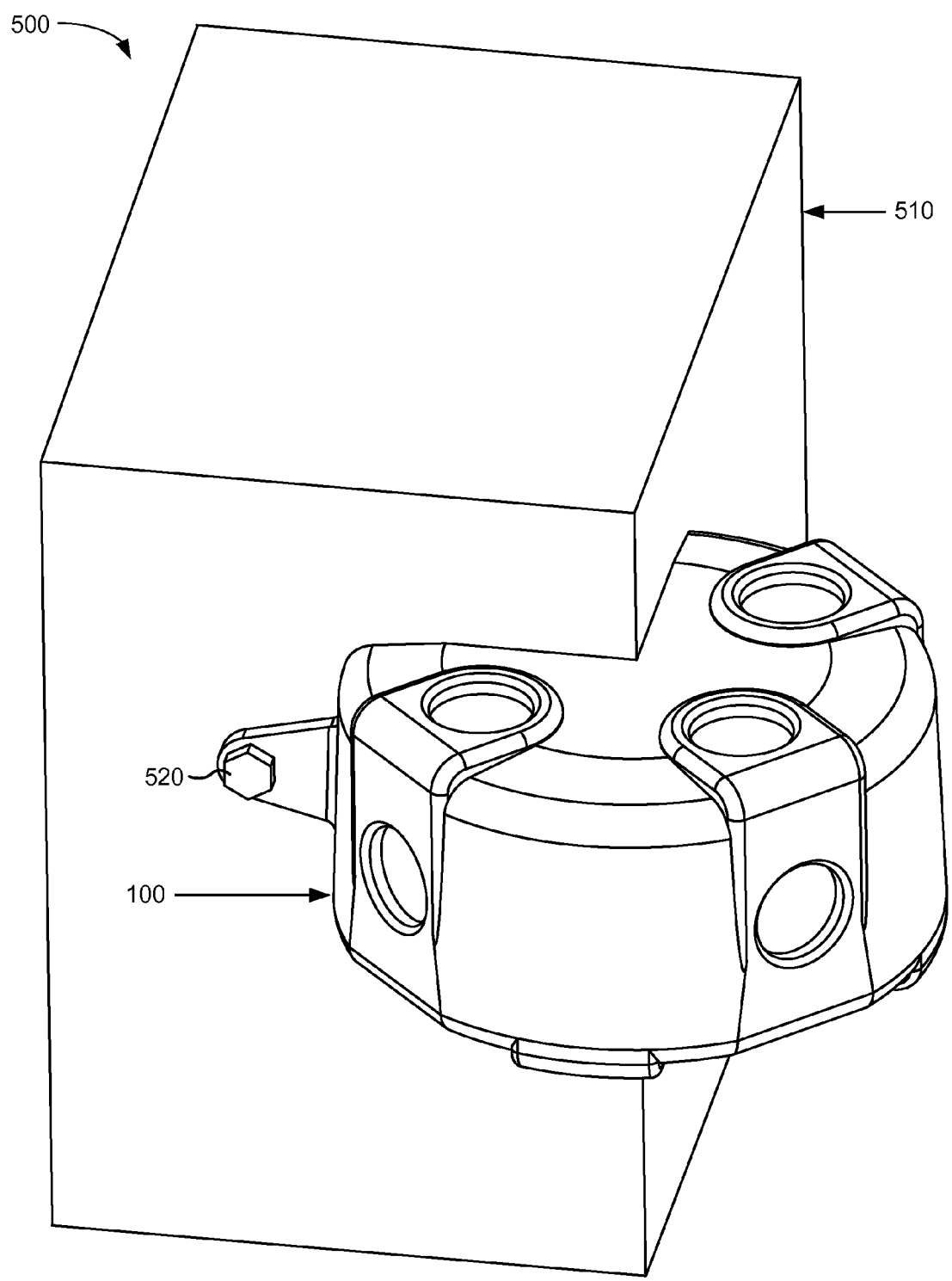
FIG. 5 is a diagram of a weatherproof corner box mounted to the side of a building according to an implementation described herein.

FIG. 5 is a diagram of a system 500 that includes a weatherproof corner box mounted to the side of a building according to an implementation described herein. As shown in FIG. 5, system 500 may include corner box 100 mounted to the outside corner of a building 510 using one or more fasteners 520 (e.g., bolts). As can be seen in FIG. 5, mounting corner box 100 on the outside corner of building 510 results in mounting outlets of corner box 100 pointing outwardly from both sides of building 510. Thus, electrical devices may be mounted to corner box 100 to point outwardly from both sides of building 510.

Figure 6:
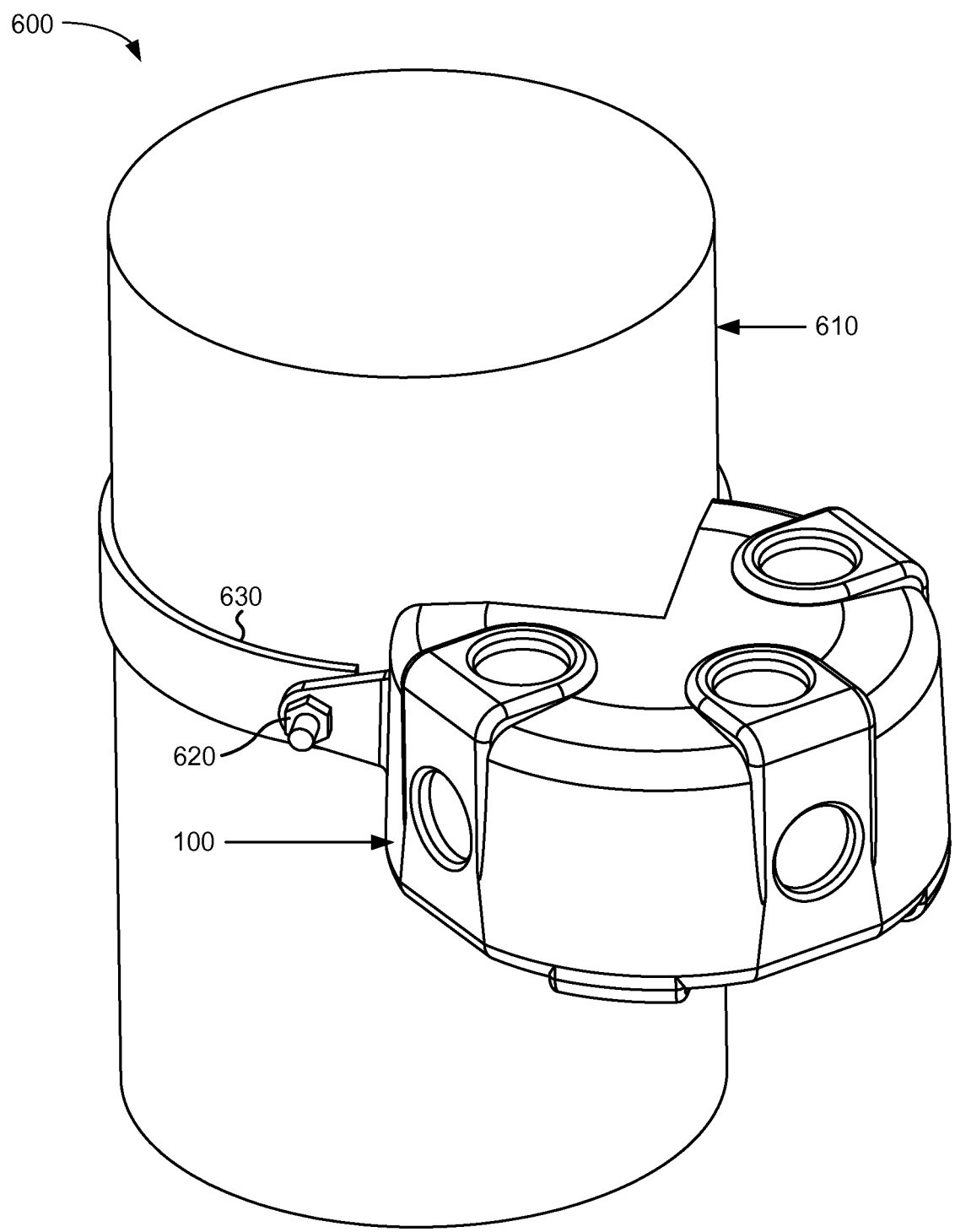
FIG. 6 is a diagram of a weatherproof corner box mounted to a pole according to an implementation described herein.

FIG. 6 is a diagram of a system 600 that includes a weatherproof corner box mounted to a pole according to an implementation described herein. As shown in FIG. 6, system 600 may include corner box 100 mounted to a cylindrical pole 610 using one or more fasteners 620 (e.g., bolts) and a pipe clamp 630. Pole 610 may be, for example, part of a light pole, a flag pole, a fence post, and/or any other structure that includes a cylindrical pole (or a pole of a different cross-sectional shape, such as a rectangular pole). As can be seen in FIG. 6, mounting corner box 100 onto pole 610 results in mounting outlets of corner box 100 pointing in multiple directions. Thus, electrical devices may be mounted to corner box 100 to point in multiple directions with respect to pole 610.

While corner box 100 (and corner box 400) have been illustrated with inside corner 130 (and inside corner 430) as being of a rectangular shape to match the outside corner of a building, in other implementations, when corner box 100 (or corner box 400) are to be mounted to cylindrical pole, such as pole 610, corner box 100 (and corner box 400) may include inside corner 130 (and inside corner 430) that is of a curved shape to match the contour of pole 610.

Figure 7:
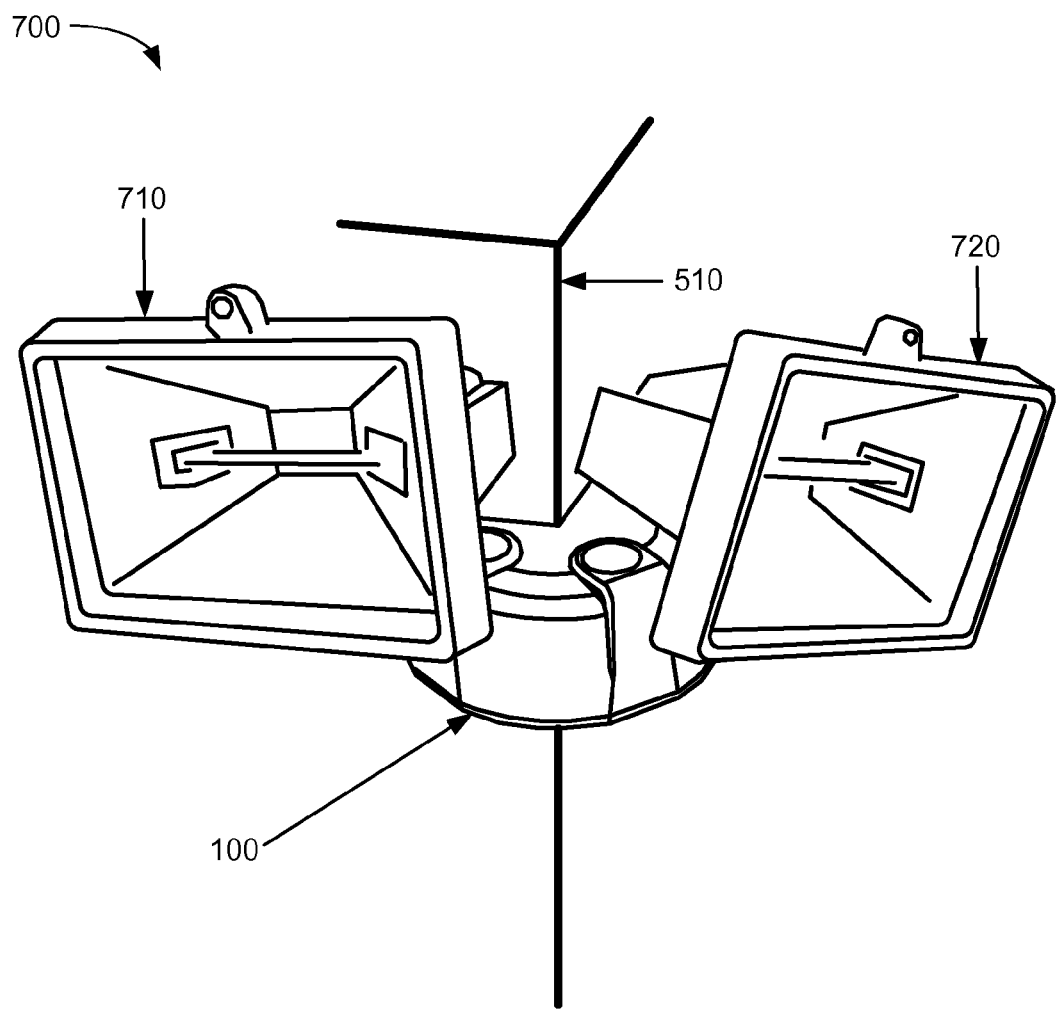
FIG. 7 is a diagram of a first exemplary system of using a weatherproof corner box according to an implementation described herein.

FIG. 7 is a diagram of a first exemplary system 700 of using corner box 100 according to an implementation described herein. As shown in FIG. 7, exemplary system 700 may include corner box 100 mounted to the outside corner of building 510 and may include a first floodlight 710 and a second flood light 720. First flood light 710 may be mounted in a first top mounting outlet 154 and may point outwardly and/or downwardly from a first side of building 510. Second flood light 720 may be mounted in a second top mounting outlet 154 and may point outwardly and/or downwardly from a second side of building 510. Thus, both sides of building 510 may be illuminated using first floodlight 710 and second floodlight 720 mounted onto corner box 100.

Figure 8:
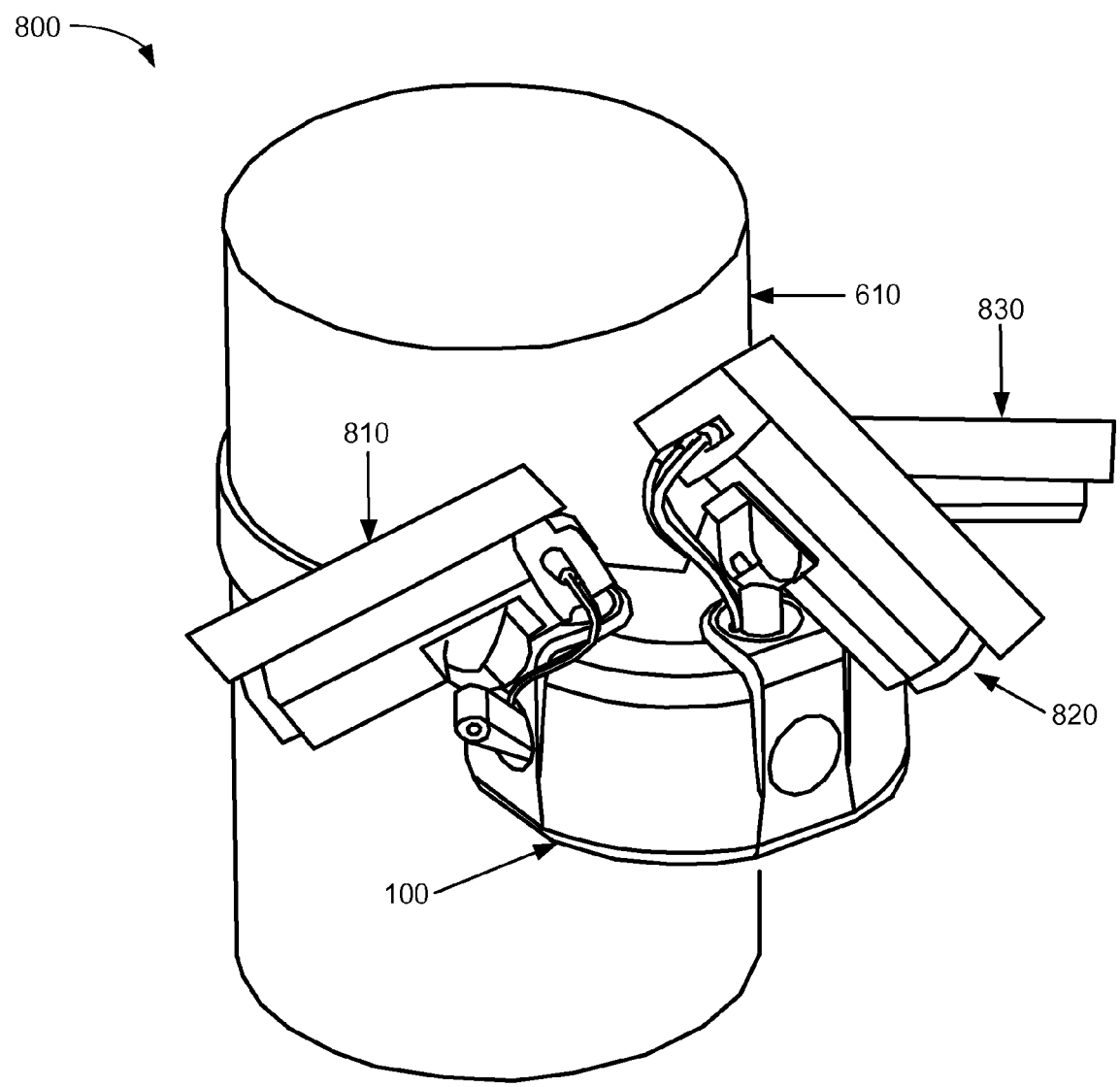
FIG. 8 is a diagram of a second exemplary system of using a weatherproof corner box according to an implementation described herein.

FIG. 8 is a diagram of a second exemplary system 800 of using a weatherproof corner box according to an implementation described herein. As shown in FIG. 8, exemplary system 800 may include corner box 100 mounted to pole 610 and may include a first camera 810, a second camera 820, and a third camera 830.

First camera 810 may be mounted in a first side mounting outlet 152 and may face in a first direction with respect to pole 610. Second camera 820 may be mounted in a top mounting outlet 154 and may face in a second direction with respect to pole 610. Third camera 830 may be mounted in a second side mounting outlet 152 and may face in a third direction with respect to pole 610. Thus, first camera 810, second camera 820, and third camera 830 may be mounted to point in multiple directions and may cover a 270 degree (or more) field of view when mounted in corner box 100 as shown in FIG. 8.

The foregoing description of exemplary implementations provides illustration and description, but is not intended to be exhaustive or to limit the embodiments described herein to the precise form disclosed. Modifications and variations may be made in light of the above teachings or may be acquired from practice of the embodiments.

For example, the inside corner may be formed at angles other than a right angle to accommodate a structure that has sides that meet at an angle other than a right angle. Thus, if a building includes a 120 degree corner, a corner box as described herein, which is to be mounted on the 120 degree corner, could be manufactured with an inside corner whose side walls meet at 120 degrees.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the present application should be construed as critical or essential to the embodiments unless explicitly described as such. Also, as used herein, the article "a" is intended to include one or more items. Further, the phrase "based on" is intended to mean "based, at least in part, on" unless explicitly stated otherwise.

What is claimed is:

1. A weatherproof electrical box comprising:
   a housing body enclosing a cavity, wherein the housing body includes an access opening extending across a first plane of the housing body, wherein the housing body further includes a plurality of mounting outlets configured to enable electrical devices to be mounted to the housing body to face a plurality of different directions, and wherein each one of the plurality of mounting outlets is covered with a watertight seal;
   one or more mounting brackets attached to the housing body;
   a cover plate shaped to match and cover the access opening of the housing body with a watertight seal, wherein the cover plate includes at least one mounting outlet covered with a watertight seal;
   wherein the housing body includes a first side wall and second side wall aligned to form an inside corner of the housing body, wherein the inside corner of the housing body is configured to align with an outside corner of a building or a structure, and wherein the first side wall and the second side wall are perpendicular to the first plane.

2. The weatherproof electrical box of claim 1, wherein the first side wall includes at least one opening.

3. The weatherproof electrical box of claim 1, wherein the plurality of mounting outlets are covered with removable knockout plates or removable plugs.

4. The weatherproof electrical box of claim 1, wherein the housing body has a substantially cylindrical shape.

5. The weatherproof electrical box of claim 1, wherein the housing body has an L-shaped cross-sectional shape.

6. The weatherproof electrical box of claim 1, wherein the housing body includes:
   a top wall having a substantially planar surface; and
   a curved side wall extending from the top wall;
   wherein the plurality of mounting outlets includes one or more first mounting outlets in the top wall and one or more second mounting outlets in the curved side wall.

7. The weatherproof electrical box of claim 6, wherein the one or more first mounting outlets include at least three first mounting outlets distributed equidistantly with respect to each other, wherein the one or more second mounting outlets include at least three second mounting outlets distributed equidistantly from each other, and wherein the at least three first mounting outlets are aligned with the at least three second mounting outlets.

8. The weatherproof electrical box of claim 1, wherein at least one of the plurality of mounting outlets is surrounded by a reinforced area of the housing body.

9. The weatherproof electrical box of claim 1, wherein the housing body and the cover plate include a plastic material.

10. The weatherproof electrical box of claim 1, wherein the housing body and the cover plate include a metal material.

11. The weatherproof electrical box of claim 1, wherein the one or more mounting brackets include a pipe clamp configured to mount the electrical box to a cylindrical structure.

12. The weatherproof electrical box of claim 1, further comprising:
   a gasket located between the housing body and the cover plate.

13. A weatherproof electrical box comprising:
   a housing body comprising:
      a top wall, wherein the top wall includes a first plurality of mounting outlets, wherein each one of the first plurality of mounting outlets is covered with a watertight seal;
      a curved side wall extending from the top wall to a bottom surface of the housing body, wherein the curved side wall includes a second plurality of mounting outlets, wherein each one of the second plurality of mounting outlets is covered with a watertight seal;
      a first side wall and a second side wall forming a right angle, the first side wall and second side wall configured to align with a corner of a building and extending from the top wall to the bottom surface, wherein the first side wall includes a first side wall opening and the second side wall includes a second side wall opening;
   one or more mounting brackets;
   a cover plate shaped to match the bottom surface of the housing body with a watertight seal, wherein the cover plate includes a third plurality of mounting outlets, and wherein each one of the third plurality of mounting outlets is covered with a watertight seal;
   wherein the first plurality of mounting outlets, the second plurality of mounting outlets, and the third plurality of mounting outlets are configured to enable electrical devices to be mounted to the housing body, and wherein the first plurality of mounting outlets, the second plurality of mounting outlets, and the third plurality of mounting outlets are covered by removable knockout plates or removable plugs.

14. The weatherproof electrical box of claim 13, wherein the first plurality of mounting outlets includes at least three first mounting outlets distributed on the top wall, wherein the second plurality of mounting outlets includes at least three second mounting outlets distributed equidistantly along the curved side wall, wherein the at least three first mounting outlets are aligned with the at least three second mounting outlets.

15. The weatherproof electrical box of claim 13, wherein the first plurality of mounting outlets, the second plurality of mounting outlets, and the third plurality of mounting outlets are surrounded by a reinforced area of the housing body.

16. The weatherproof electrical box of claim 13, further comprising:
   a foam or rubber gasket located between the housing body and the cover plate.

17. A system comprising:
   an electrical box comprising:
      a housing body enclosing a cavity, wherein the housing body includes an access opening extending across a first plane of the housing body and a plurality of mounting outlets;
      one or more mounting brackets attached to the housing body; and
      a cover plate covering the access opening of the housing body with a watertight seal, wherein the cover plate includes at least one mounting outlet covered with a watertight seal;
      wherein the housing body includes a first side wall and second side wall aligned to form an inside corner of the housing body, wherein the inside corner of the housing body is configured to align with an outside corner of a structure, when the electrical box is mounted to the outside corner of the structure using the one or more mounting brackets; and
   a plurality of electrical devices, mounted to the electrical box via at least some of the plurality of mounting outlets located in the housing body, wherein at least a first one of the plurality of electrical devices points toward a first side of the outside corner of the structure and at least a second one of the plurality of electrical devices points toward a second side of the outside corner of the structure, when the electrical box is mounted to the outside corner of the structure, and wherein remaining ones of the plurality of mounting outlets, which do not include one of the plurality of electrical devices, are covered with a watertight seal.

18. The system of claim 17, wherein at least one of the first side wall or the second side wall includes an inside opening and wherein a power cord or conduit associated with at least one of the plurality of electrical devices is configured to pass through the inside opening, when the electrical box is mounted to the outside corner of the building.

19. The system of claim 17, wherein the plurality of electrical devices includes:
   a camera;
   a floodlight; or
   a motion sensor.

* * * * *